US008077880B2

(12) United States Patent
Bharitkar et al.

(10) Patent No.: US 8,077,880 B2
(45) Date of Patent: Dec. 13, 2011

(54) COMBINED MULTIRATE-BASED AND FIR-BASED FILTERING TECHNIQUE FOR ROOM ACOUSTIC EQUALIZATION

(75) Inventors: Sunil Bharitkar, Los Angeles, CA (US); Chris Kyriakakis, Altadena, CA (US)

(73) Assignee: Audyssey Laboratories, Inc., Los Angeles, CA (US)

( * ) Notice: Subject to any disclaimer, the term of this patent is extended or adjusted under 35 U.S.C. 154(b) by 1145 days.

(21) Appl. No.: 11/801,876

(22) Filed: May 11, 2007

(65) Prior Publication Data

US 2008/0279318 A1 Nov. 13, 2008

(51) Int. Cl.
*H03G 5/00* (2006.01)
(52) U.S. Cl. ........................................... 381/98; 381/99
(58) Field of Classification Search ............. 381/58–59, 381/98–103
See application file for complete search history.

(56) References Cited

U.S. PATENT DOCUMENTS 4,888,808 A * 12/1989 Ishikawa et al. .............. 381/103
5,572,443 A * 11/1996 Emoto et al. .................. 702/103
5,805,715 A * 9/1998 Rhee ............................... 381/98
2004/0264718 A1* 12/2004 Arai .............................. 381/309
2005/0244012 A1* 11/2005 Asada ............................ 381/56

* cited by examiner

*Primary Examiner* — Vivian Chin
*Assistant Examiner* — Fatimat O Olaniran
(74) *Attorney, Agent, or Firm* — Kenneth L. Green

(57) ABSTRACT

A combined multirate-based Finite Impulse Response (FIR) filter equalization technique combines a low-order FIR equalization filter operating at a lower rate for equalization of a loudspeaker-room response at low frequencies, and a complementary low-order minimum-phase FIR equalization filter operating at a higher rate for equalization of the loudspeaker-room response at higher frequencies. The design of two complementary band filters for separately performing low and high frequency equalization, keeps the system delay at a minimum while maintaining excellent equalization performance. Splicing between the two equalization filters, for maintaining a flat magnitude response in the transition region of the two complementary filters, is done automatically through level adjustment of one equalization filter relative to the other. The present invention achieves excellent equalization at low filter orders and hence reduced computational complexity.

10 Claims, 6 Drawing Sheets

COMBINED MULTIRATE-BASED AND FIR-BASED FILTERING TECHNIQUE FOR ROOM ACOUSTIC EQUALIZATION

BACKGROUND OF THE INVENTION

The present invention relates to acoustic equalization and in particular to filters used for acoustic equalization.

Loudspeaker-room acoustic equalization is a challenging problem to solve with realizable digital equalization filters, especially at lower frequencies (for example, less than 300 Hz). A typical room is an acoustic enclosure which may be modeled as a linear system. When a loudspeaker is placed in the room, the resulting response is the convolution of the room linear response and the loudspeaker response and may be denoted as h(n); $n \in \{0, 1, 2, \ldots\}$. This loudspeaker-room impulse response has an associated frequency response, $H(e^{j\omega})$ (i.e., H(z)), which is a function of frequency. Generally, $H(e^{j\omega})$ is also referred to as the Loudspeaker-Room Transfer Function (LRTF). In the frequency domain, the LRTF shows significant spectral peaks and dips in the human range of hearing (for example, 20 Hz to 20 kHz), in the magnitude response, causing audible sound degradation at a listener position.

FIG. 1 shows the LRTF (unsmoothed 10 and third-octave smoothed 12) of the loudspeaker-room response. As is evident from the ⅓-octave smoothed magnitude response plot 12, the loudspeaker-room response exhibits a large gain of about 10 dB at 75 Hz and the peak is about an octave wide which will result in unwanted amplification of sound in this region. A notch at around 145 Hz about a half-octave wide will attenuate sound in this region. Additional variations are present throughout the frequency range of hearing (20 Hz-20 kHz), and a non-smooth and non-flat envelope of the response, result in a poor sound reproduction from the loudspeaker in the room where the room linear response and the loudspeaker response h(n) was measured.

An equalization filter may be applied to correct such response variations in the frequency domain (i.e., minimize the deviations in the magnitude response to obtain a flat response) and ideally also minimize the energy of the reflections in the time domain. Known approaches include using psychoacoustic warping where the equalization filter is designed on a warped frequency axis (i.e., the perceptual Bark scale) of the room response function with a lower order model (for example, linear predictive coding). Other similar approaches using low-order spectral modeling and warping are described in:

M. Karjalainen, E. Piirilii, A. Jarvinen, and J. Huopaniemi, "Comparison of Loudspeaker Response Equalization Using Warped Digital Filters," *Journal of Audio Eng. Soc.*, 47 (1/2), pp. 15-31, 1999;

M. Karjalainen, A. Harma, U. K. Laine, and J. Huopaniemi, "Warped Filters and Their Audio Applications," *Proc.* 1997 *IEEE Workshop on Applications of Signal Processing to Audio and Acoustics* (*WASPAA* '97), New York, 1997; and A. Harma, M. Karjalainen, L. Savioja, V. Valimaki, U. K. Laine, and J. Huopaniemi, "Frequency-Warped Signal Processing for Audio Applications," Journal of Audio Eng. Soc., vol. 48, no. 11, pp. 1011-1031, November 2000.

BRIEF SUMMARY OF THE INVENTION

The present invention addresses the above and other needs by providing a combined multirate-based Finite Impulse Response (FIR) filter equalization technique combining a low-order FIR equalization filter operating at a lower rate for equalization of a loudspeaker-room response at low frequencies, and a complementary low-order minimum-phase FIR equalization filter operating at a higher rate for equalization of the loudspeaker-room response at higher frequencies. The design of two complementary band filters for separately performing low and high frequency equalization keeps the system delay at a minimum while maintaining excellent equalization performance. The two equalization filters are separately applied to two parallel equalization paths with splicing of outputs of the two equalization paths. Level adjustment of one equalization path relative to the other is performed before splicing for maintaining a flat magnitude response in the transition region of the two complementary filters. The present invention achieves excellent equalization at low filter orders and hence reduced computational complexity and signal processing requirements.

In accordance with one aspect of the invention, there is provided a method for equalizing audio signals. The method includes parallel processing of an input signal through a low frequency equalization path and a high frequency equalization path. The low frequency equalization path includes steps of: low pass filtering the input signal to obtain a low pass filtered signal; sub sampling the low pass filtered signal to obtain a sub-sampled signal; equalizing the sub-sampled signal with a low frequency equalization filter to obtain an equalized low frequency sub-sampled signal; up sampling the equalized low frequency sub-sampled signal to obtain an up-sampled low frequency equalized signal; and low pass filtering the up-sampled low frequency equalized signal to obtain a low frequency equalized signal. The high frequency equalization path includes steps of: high pass filtering the input signal to obtain a high pass filtered signal and equalizing the high pass filtered signal to obtain a high frequency equalized signal. The low frequency equalized signal and the high frequency equalized signal are summed to obtain an equalized signal. The high frequency equalized signal may further be leveled if desired to maintain a flat magnitude response in the transition region of the two equalization paths.

In accordance with another aspect of the invention, there is provided a method for computing low frequency and high frequency equalization filters. Computing the low frequency equalization filter includes steps of: low pass filtering H(z) the z transform of the room response h(n); sub sampling the filtered H(z); computing F(z) from the sub sampled filtered H(z); up sampling F(z) to obtain F'(z); computing C(z) as the product of F'(z) and H(z); computing a magnitude response of C(z); and computing a mean level L1 of the magnitude response. Computing the high frequency equalization filter includes steps of: high pass filtering H(z); computing an initial G(z); computing D(z) as the product of the initial G(z) and H(z); constraining FFT bins below Fs/2M to 0 dB; computing the magnitude response of D(z); computing a mean level L2 of the magnitude response at step 110; and applying a level adjustment of $10^{((L1-L2)/20)}$ to the initial G(z) to obtain G(z).

BRIEF DESCRIPTION OF THE SEVERAL VIEWS OF THE DRAWING

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing one or more preferred embodiments of the invention. The scope of the invention should be determined with reference to the claims.

The present invention comprises the formation of an equalization (or inverse) filter, $h_{eq}(n)$, which compensates for the effects of the loudspeaker and room which cause sound quality degradation at a listener position. In other words, the goal is to satisfy $h_{eq}(n) \otimes h(n) = \delta(n)$, where $\otimes$ denotes the convolution operator and $\delta(n)$ is the Kronecker delta function.

In practice, an ideal delta function is not achievable with low filter orders as room responses are non-minimum phase. Furthermore, from a psychoacoustic standpoint, a target curve, such as a low-pass filter having a reasonably high cutoff frequency is generally applied to the equalization filter (and hence the equalized response) to prevent the played back audio from sounding exceedingly "bright". An example of a low-pass cutoff frequency is the frequency where the loudspeaker begins its high-frequency roll-off in the magnitude response. Additionally, the target curve may also be customized according to the size and/or the reverberation time of the room. Additionally, a high pass filter may be applied to the equalized response, depending on the loudspeaker size and characteristics (for example, a satellite channel loudspeaker), in order to minimize distortions at low frequencies. Examples of environments where multiple listener room response equalization is used are in home theater (for example, a multichannel 5.1 system), automobile, movie theaters, etc.

In audio playback applications, where a general goal is to enhance the quality of speech/audio reproduction, a typical setup process includes measuring the loudspeaker room impulse response at least one measurement position (generally an expected listener position), and designing the equalization filter $h_{eq}(n)$ based on the measurements. The equalization filter $h_{eq}(n)$ is designed to compensate for spectral deviations in the magnitude domain and/or to minimize the energy of reflections in the time domain. The equalization filter $h_{eq}(n)$ is generated based on a model which fits the measured response for real-time applications.

Figure 2A:
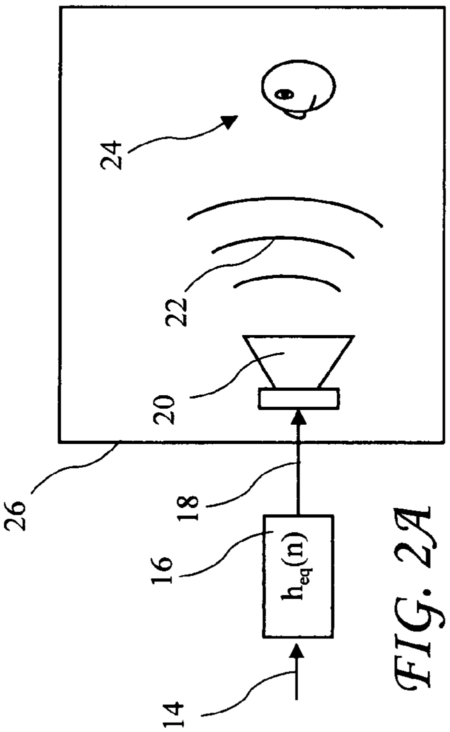
FIG. 2A depicts a general listener environment including a speaker and room.
Figure 2B:
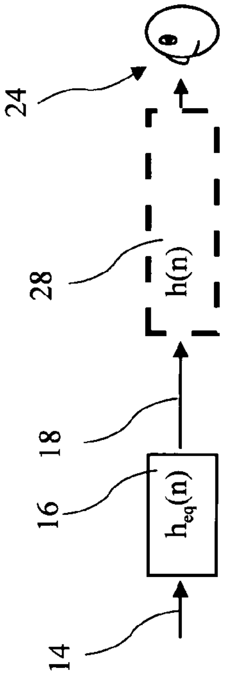
FIG. 2B depicts the general listener environment of FIG. 2A in terms of a Loudspeaker-Room Transfer Function (LRTF).
Figure 1:
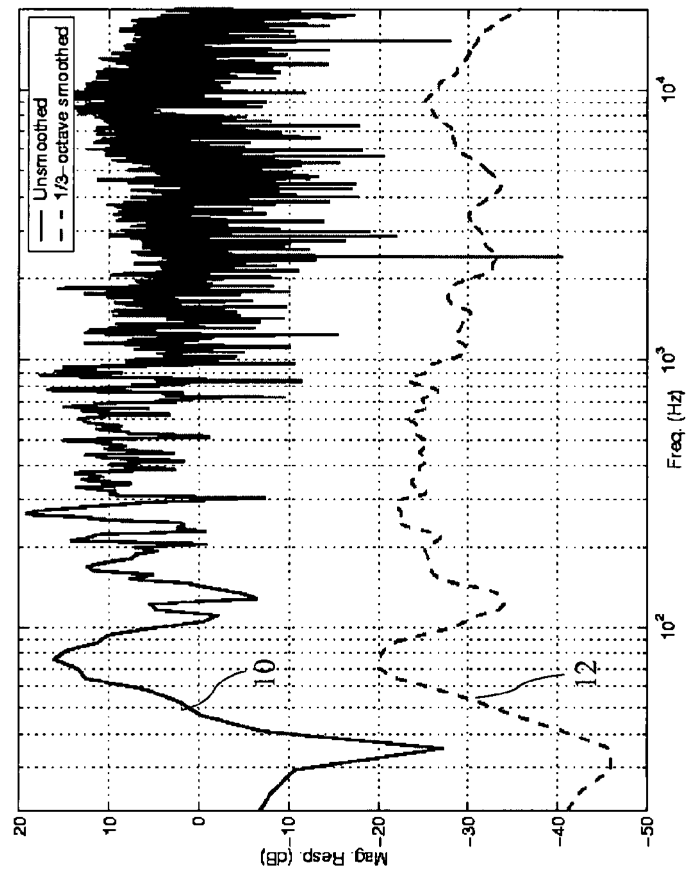
FIG. 1 is the unsmoothed and third-octave smoothed Loudspeaker-Room Transfer Function (LRTF) of the loudspeaker-room response.

A generalized diagram of a playback chain comprising an unfiltered signal 14, an equalization filter 16, an equalized signal 18 produced by the equalizer 16, a loud speaker 20 receiving the equalized signal 18, sound waves 22 generated by the speaker 20, and a listener 24 hearing the sound waves 22 are shown in FIG. 2A. At the least, the speaker 20, sound waves 22, and listener 24 are in a room 26. The characteristics of the speaker 20, the sound waves 22, and the room 26 combine to create a Loudspeaker-Room Transfer Function (LRTF) $H(e^{j\omega})$ and the corresponding loudspeaker-room impulse response h(n). The elements of FIG. 2A are represented in terms of the loudspeaker-room impulse response h(n) replacing the speaker 20, sound waves 22, and room 26 in FIG. 2B. The equalization filter 16, derived from the measured loudspeaker-room impulse response h(n), does not change unless the loudspeaker is physically moved to another location, in which case the loudspeaker-room impulse response h(n) would need to be re-measured and the equalization filter 16 re-derived. Furthermore, the responses vary with listening position. Advantageously, the present invention may be adapted for multiple-listener applications.

Unfortunately, it is difficult to achieve effective low-frequency equalization below 300 Hz with low-order and realizable Finite Impulse Response (FIR) equalization filters. The present invention comprises a combined multirate-based and FIR-based filtering technique shown in FIG. 3 to address this difficulty. The system includes a high frequency equalization filter G(z) 56 operating at the sample rate fs of an unfiltered input signal 30 (for example, fs=48 kHz), and a low frequency equalization filter F(z) 40 operating at a sub-sampled rate fs' of the signal 30 (for example, fs'=fs/24=2 kHz). Hereafter, fs/fs' is referred to as a sub-sampling rate M. The low frequency equalization filter F(z) 40 operates in the low-frequency region for obtaining better resolution for equalization at low frequencies. The combined multirate-based and FIR-based filtering technique of the present invention requires only two-bands where one band is filtering at the low-rate fs', thereby avoiding large delays which would result from the use of several filter-banks of linear-phase FIR filters for real-time implementation.

The input signal 30 is processed in a low frequency path A by a low pass filter $H_{lp}(z)$ 32 to generate a low pass filtered signal 34, and the low pass filtered signal 34 is down sampled by M (typically 24) in down sampler 36 to generate a sub-sampled signal 38. The sub-sampled signal 38 is processed by the low frequency equalization filter F(z) 40 to generate an equalized low frequency sub-sampled signal 42. The equalized low frequency sub-sampled signal 42 is up sampled by M (typically 24) in up-sampler 44 to generate an up-sampled low frequency equalized signal 46. The up-sampler 44 is preferably an interpolation. The up-sampled low frequency equalized signal 46 is filtered by a second low pass filter 48 to generate a filtered low frequency equalized signal 50.

The input signal 30 is processed in parallel in a high frequency path B by a high pass filter $H_{hp}(z)$ 52 to generate a high pass filtered signal 54. The high pass filtered signal 54 is processed by the high frequency equalization filter G(z) 56 to generate a high frequency equalized signal 57. The high frequency equalized signal 57 may be leveled by level 58 to generate a leveled high frequency signal 59. The filtered low frequency equalized signal 50 and the leveled signal 59 are summed by the summer 60 to generate an equalized signal 62.

Figure 3:
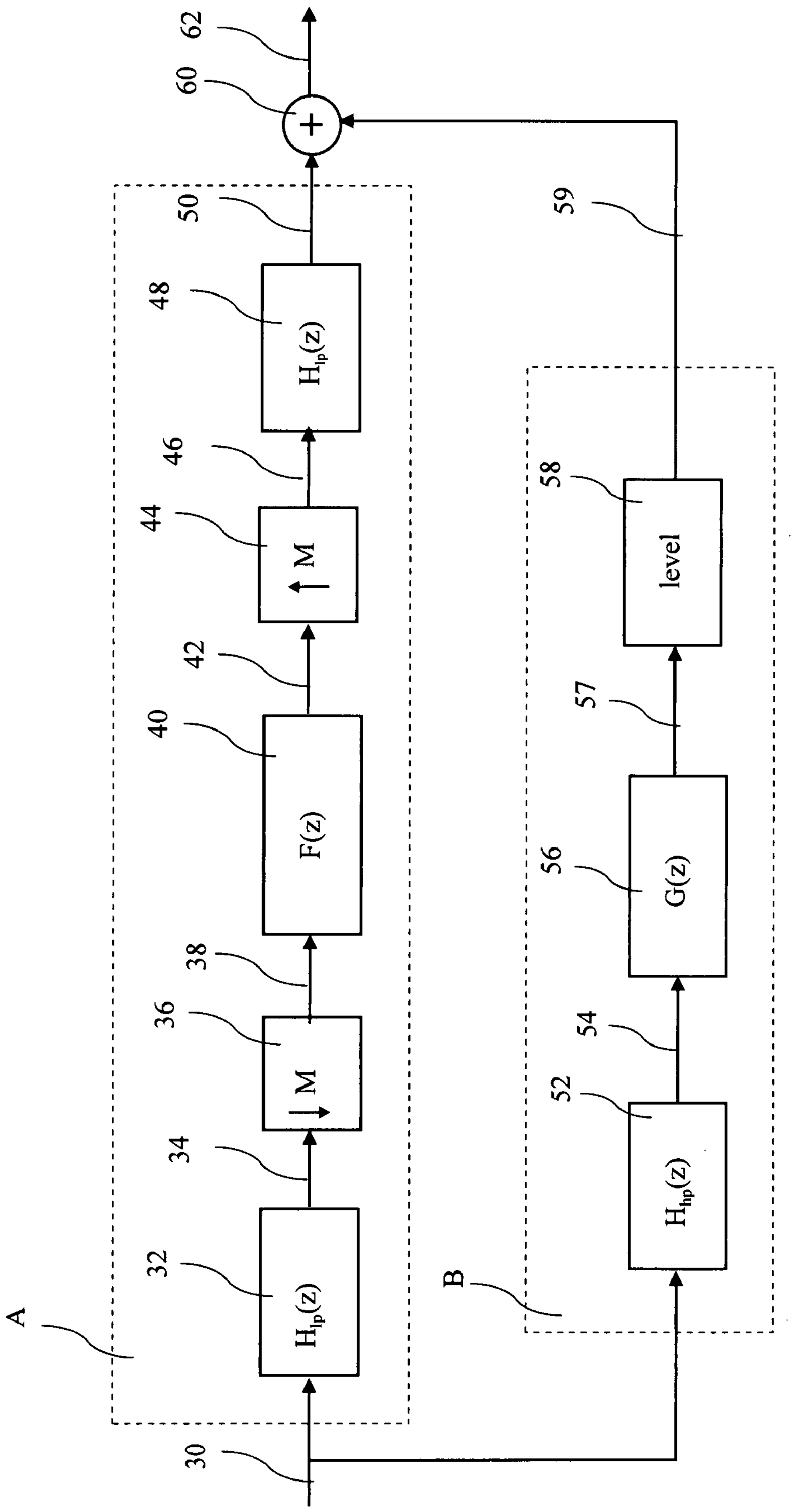
FIG. 3 shows a multirate Finite Impulse Response (FIR) filter based equalization system according to the present invention.

The level 58 is preferably a leveling of 10((L1−L2)/20) described in FIG. 7 below. This leveling may be performed as a separate processing 58 as shown in FIG. 3, or may be included in the high frequency equalization processing 56.

Figure 4:
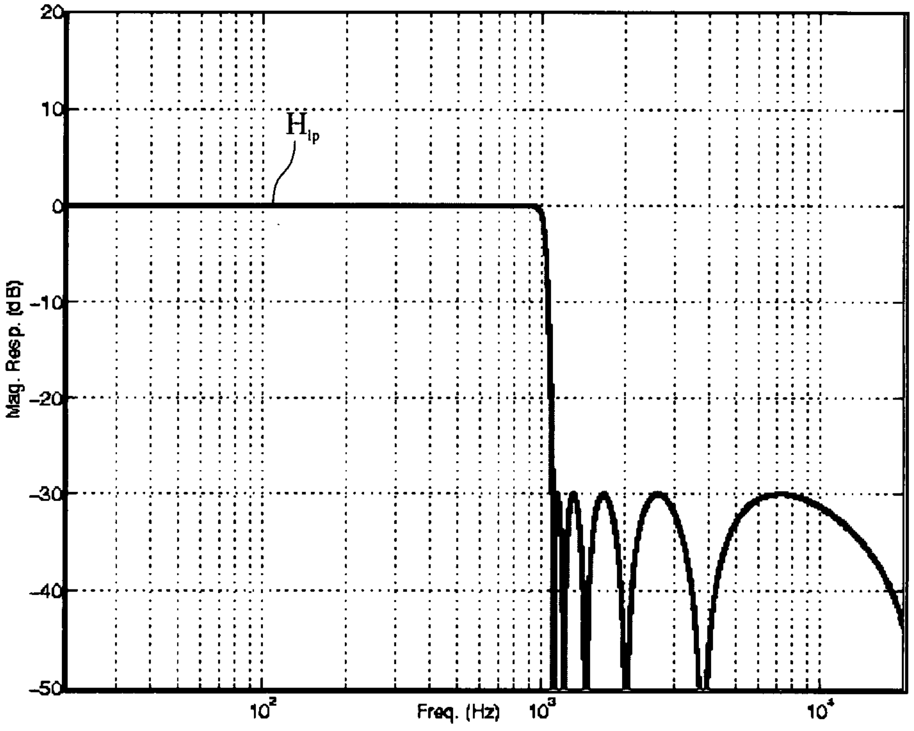
FIG. 4 is the frequency response of a low pass filter element of the multirate Finite Impulse Response (FIR) filter based equalization system.
Figure 5:
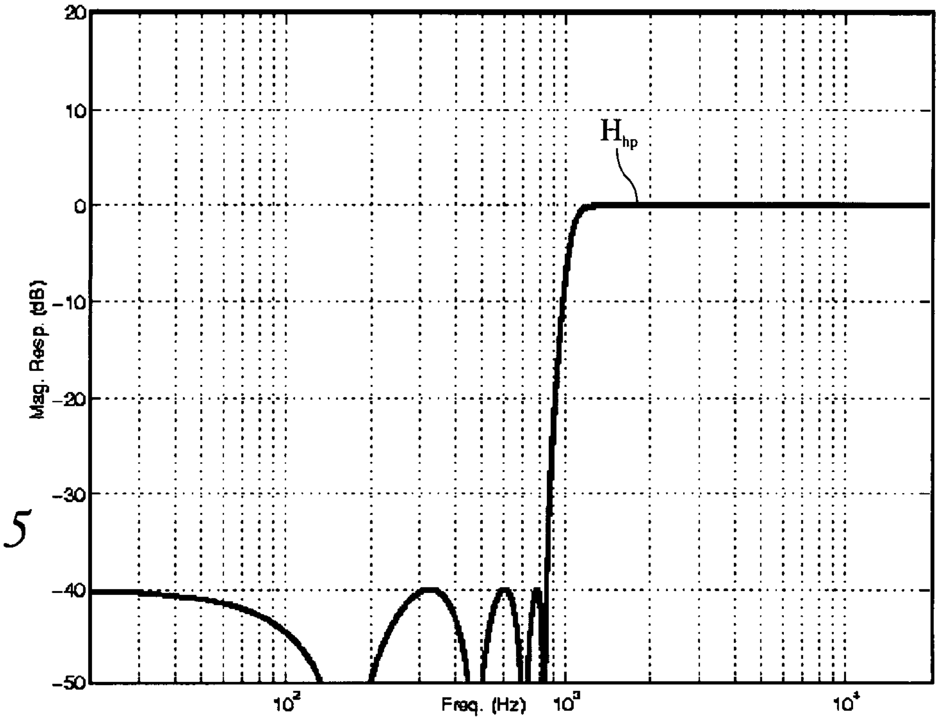
FIG. 5 is the frequency response of a high pass filter element of the multirate Finite Impulse Response (FIR) filter based equalization system.

FIGS. 4 and 5 show two preferred band-splitting filters. The low-pass filters $H_{lp}$ 32 and 48 are preferably Chebyshev Type-II IIR filters, designed at fs=48 kHz, with a pass-band frequency of 1 kHz (half the Nyquist rate) and a stop-band frequency of 1.1 kHz. The stop-band attenuation is at 30 dB. The high-pass filter $H_{hp}$ 52 Is preferably also a Chebyshev Type-II IIR filter, designed at fs=48 kHz, with a pass-band frequency of 1 kHz and stop-band frequency of 800 Hz. The stop-band attenuation is at 40 dB. When the sample frequency is altered, the filters 32, 48, and 52 may be adjusted accordingly.

Figure 6:
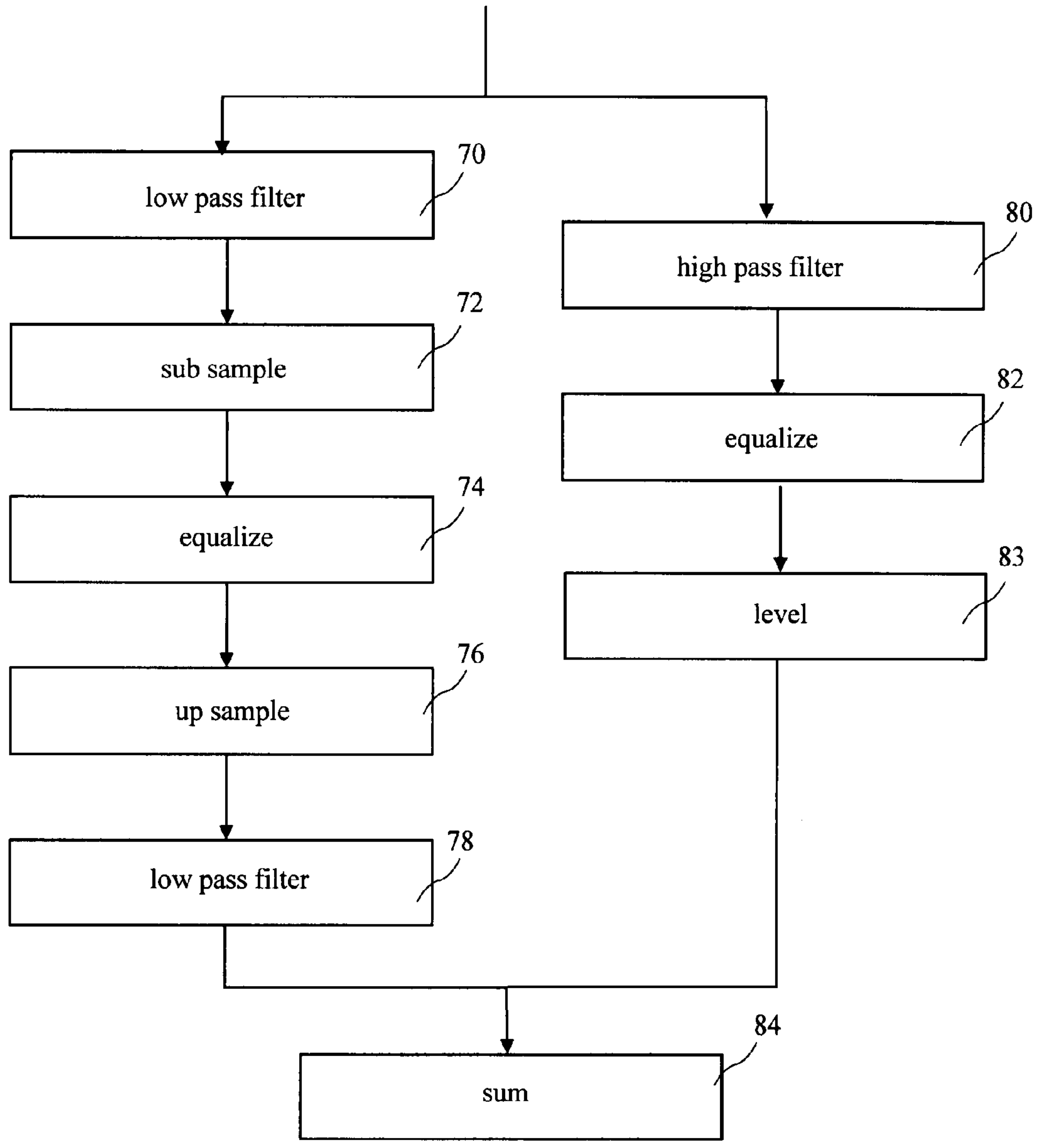
FIG. 6 describes the method of operation of the multirate Finite Impulse Response (FIR) filter based equalization system.

A method for equalizing an audio signal according to the present invention is described in FIG. 6. The method includes processing an input signal through a low frequency equalization path and a high frequency equalization path in parallel. The low frequency equalization path includes: low pass filtering the input signal to obtain a low pass filtered signal at step 70; sub sampling the low pass filtered signal to obtain a sub-sampled signal at step 72; equalizing the sub-sampled signal with a low frequency equalization filter to obtain an equalized low frequency sub-sampled signal at step 74; up sampling the equalized low frequency sub-sampled signal to obtain an up-sampled low frequency equalized signal at step 76; and low pass filtering the up-sampled low frequency equalized signal to obtain a low frequency equalized signal at step 78. The high frequency equalization path includes: high pass filtering the input signal to obtain a high pass filtered signal at step 80, equalizing the high pass filtered signal to obtain a high frequency equalized signal at step 82, and leveling the high frequency equalized signal at step 83. The low frequency equalized signal and the leveled high frequency equalized signal are summed to obtain an equalized signal at step 84.

The low rate equalization filter F(z) 40 is preferably designed using linear predictive coefficients, for example, using the Linear Predictive Coding (LPC) method, where the room response is sub-sampled before the LPC method is applied. The filter F(z) 40 is thus obtained as the inverse of an estimate of the loudspeaker room transfer function at low frequencies, $\hat{H}_1$, where the coefficients $f_m$ of the LPC are selected as the coefficients of the low rate equalization filter F(z) 40. Specifically, since the LPC polynomial is minimum-phase, the low frequency equalization filter F(z) 40 may be expressed as:

$$\hat{H}_1(e^{j\Omega T'}) = \frac{1}{\sum_{m=0}^{N_1-1} f_m T' e^{-j\Omega k T'}} \qquad (1)$$

$$T' = \frac{1}{f_s'}$$

$$F(z) = \sum_{m=0}^{N_1-1} f_m z^{-m}$$

where $f_m$ is the $m^{th}$ FIR filter coefficient of F(z) 40 and the length of the filter F(z) 40, $N_1$, was set as $N_1$=2 fs/fs'=48.

Similarly, the high frequency equalization filter G(z) 56, is preferably designed using the LPC method where the room response is high-pass filtered by the high pass filter $H_{hp}(z)$ 52 before applying an LPC fit to the room response. Specifically:

$$\hat{H}_2(e^{j\Omega T}) = \frac{1}{\sum_{m=0}^{N_2-1} g_m T e^{-j\Omega k T}} \qquad (2)$$

$$T' = \frac{1}{f_s}$$

$$G(z) = \sum_{m=0}^{N_2-1} g_m z^{-m}$$

where $\hat{H}_2$ is an estimate of the loudspeaker room transfer function above the low frequencies, $g_m$ is the $m^{th}$ FIR filter coefficient of G(z) 56, and the length $N_2$=48 is selected so as to offer a good fit to the room response at the lowest bin frequency fc=1 kHz and keep computational requirements for real-time filtering low. The length of $N_2$=48 was based on the following relation:

$$\omega = \Omega T \qquad (3)$$

$$\frac{2\pi k}{N_2} = \frac{k}{N_2} = \frac{f_c}{f_s}$$

$$N_2 = \frac{kf_s}{f_c} = \frac{f_s}{f_c} = 48 \quad (k = 1)$$

Figure 7:
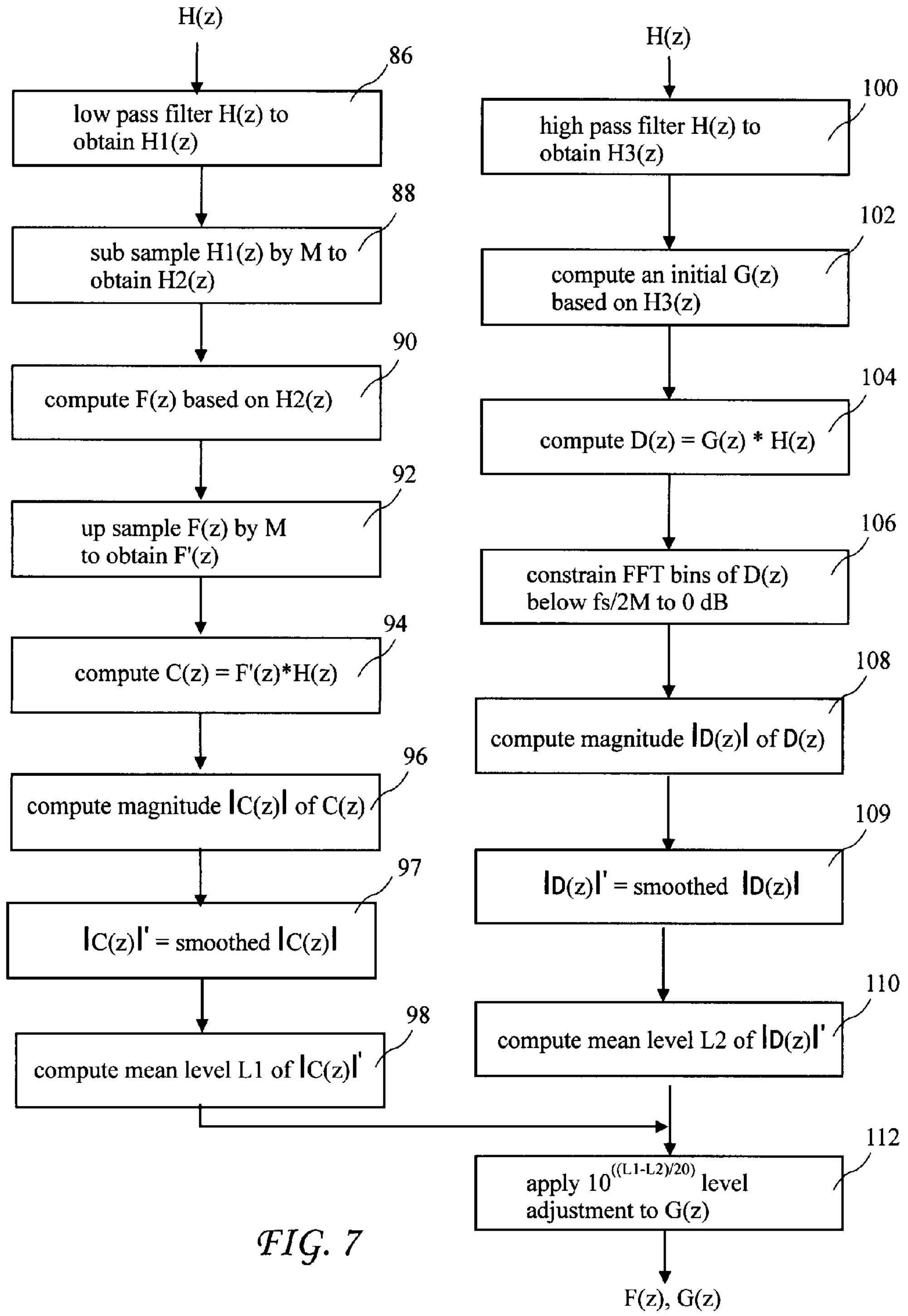
FIG. 7 is a method according to the present invention for designing equalization filters of the multirate Finite Impulse Response (FIR) filter based equalization system.

A method for computing the low frequency equalization filter F(z) 40 and the high frequency equalization filter G(z) 56 is shown in FIG. 7. The loud speaker response h(n) is measured and H(z) (the LRTF) is the z transform of h(n). The H(z) is processed in to compute F(z) and G(z) as follows. To compute F(z): H(Z) is low pass filtered, preferably using the filter $H_{lp}$ (z) 32 described above, to obtain H1(z) (for example, multiply H(z) times the z domain representation of the low pass filter) at step 86; H1(z) is sub-sampled by M to obtain H2(z) at step 88; F(z) is computed based on H2(z) at step 90; F(z) is up sampled by M (typically 24) to obtain F'(z) at step 92; the complex response C(z) is computed as the product of F'(z) and H(z) at step 94; the magnitude IC(z)I of C(z) is computed at step 96; IC(z)I is smoothed to obtain IC(z)I' at step 97 and a mean level L1 of IC(z)I' is computed at step 98.

To compute G(z): H(z) is high pass filtered, preferably using the high pass filter $H_{hp}$(Z) 52 described above, to obtain H3(z) (for example, multiply H(z) times the z domain representation of the high pass filter) at step 100; an initial G(z) is computed based on H3(z) at step 102; a second complex response D(z) is computed as the product of the initial G(z) and H(z) at step 104; the FFT bins of D(z) below fs/2M are constrained to 0 dB, where M is the sub-sampling (or decimation) rate, at step 106; the magnitude ID(Z)I of D(z) is computed at step 108; ID(Z)I is smoothed to obtain ID(Z)I' at step 109, and a mean level L2 of ID(Z)I' computed at step 110. A level adjustment of $10^{((L1-L2)/20)}$ is applied to the initial G(z) to obtain G(z) at step 114.

The smoothing in steps 97 and 109 may be, for example, ⅓ octave resolution or 1/12 octave resolution for both low and high frequency paths, Equivalent Rectangular Bandwidth (ERB) smoothing, critical-band rate scale. The low-frequency octave band for performing level matching is preferably [400, 800] Hz, whereas the high-frequency octave band is preferably [3, 6] kHz.

To better understand the processing in FIG. 7, the following example is provided when the original response h(n) (or H(z) in the frequency domain) is of length 8192. H(z) is decimating by a factor of 24 to obtain a 8192/24 tap H1(z) which is about 341 taps. Application of the LPC method in step 90 results in the equalization filter F(Z) having 72 taps. The LPC method may be directly applied to the high pass filtered H(z) to obtain the initial high frequency equalization filter G(z) having 256 taps in step 102. This is provided as an example, and methods following the steps of FIG. 7 using different numbers of elements to obtain low and high frequency equalization filters are intended to come within the scope of the present invention.

While the methods of the present invention contemplate the use of an LPC model, any method for obtaining a low frequency equalization filter and a high frequency equalization filter, which method includes first low pass filtering and sub-sampling the LRTF steps, and processing the result to obtain the low frequency equalization filter, and a first high pass filtering the LRTF step, and processing the result to obtain the high frequency equalization filter, is intended to come within the scope of the present invention.

Figure 9:
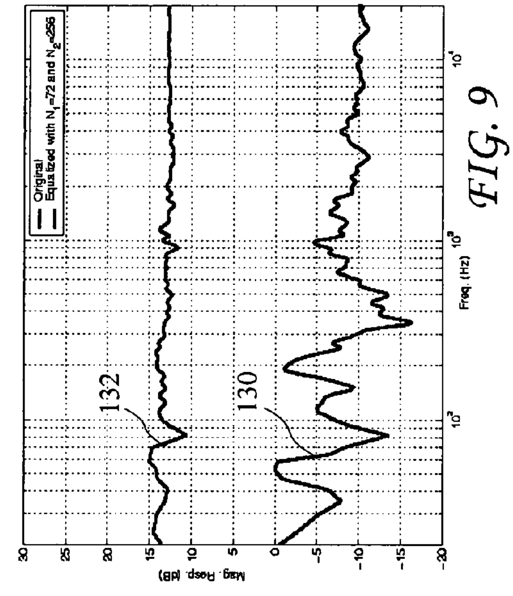
FIG. 9 is a plot of unequalized and equalized loudspeaker-room response for $N_1$ of 72 and $N_2$ of 256 for loudspeaker 2.
Figure 11:
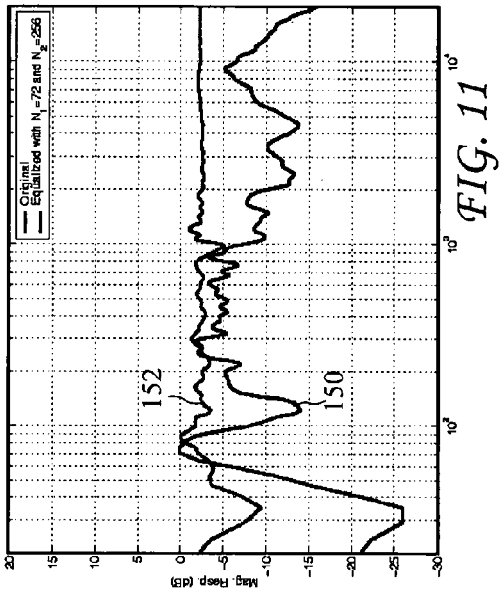
FIG. 11 is a plot of unequalized and equalized loudspeaker-room response for $N_1$ of 72 and $N_2$ of 256 for loudspeaker 4.
Figure 8:
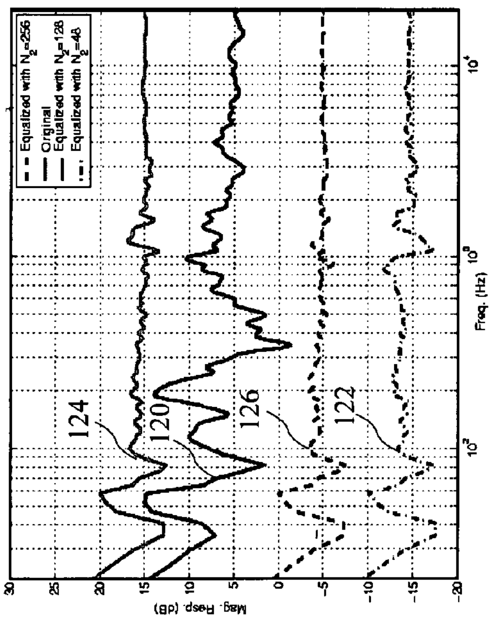
FIG. 8 is a plot of unequalized and equalized loudspeaker-room response for $N_1$ of 48 and $N_2$ of 48, 128, and 256 for loudspeaker 1.
Figure 10:
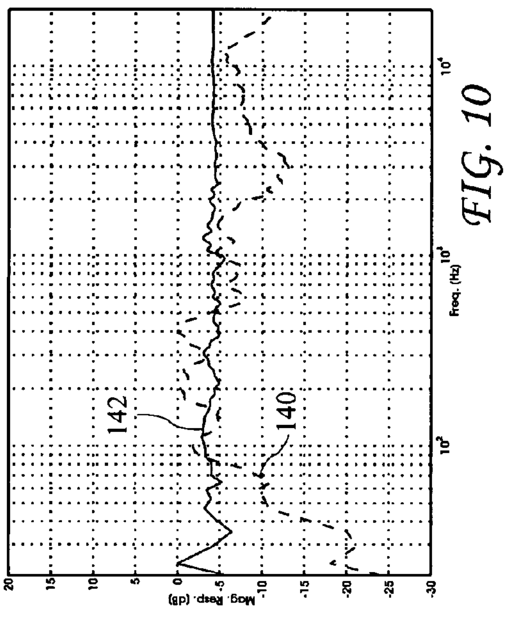
FIG. 10 is a plot of unequalized and equalized loudspeaker-room response for $N_1$ of 72 and $N_2$ of 256 for loudspeaker 3.

The room responses were obtained in a reverberant room having a Schroeder reverberation time T60 (computed using the backward integration method) of approximately 0.5 seconds. The responses were measured roughly on-axis at a distance of about six meters from the loudspeaker. An unequalized loudspeaker and room response 120 for a first loudspeaker is shown in FIG. 8. The equalized responses are shown for the low-rate equalization filter length of N1=48 and high-rate equalization filter lengths N2 lengths of 48 (line 122), 128 (line 124), and 256 (line 126) for a first loudspeaker. As is evident, significant equalization is achieved by using a fairly small number of FIR coefficients in this dual-rate technique. FIGS. 9-11 show the performance for other loudspeakers in the same room, on-axis, and at the same distance in front of the speaker.

FIG. 9 shows an unequalized loudspeaker and room response 130 and equalized response for the low-rate equalization filter length of N1=72 and high-rate equalization filter lengths N2 lengths of 256 (line 132) for a second loudspeaker. FIG. 10 shows an unequalized loudspeaker and room response 140 and equalized response for the low-rate equalization filter length of N1=72 and high-rate equalization filter lengths N2 lengths of 256 (line 142) for a third loudspeaker. FIG. 11 shows an unequalized loudspeaker and room response 150 and equalized response for the low-rate equalization filter length of N1=72 and high-rate equalization filter lengths N2 lengths of 256 (line 152) for a fourth loudspeaker.

No target curves, such as ones used for limiting the loudspeakers from being overdriven, are shown as the goal was to demonstrate the improvements obtained with this technique. As is clearly evident a substantial equalization is achieved with short FIR filter lengths in both bands. Listening tests after applying specific speaker dependent target curves revealed dramatic and audible improvement in playback audio quality (speech as well as music).

The present invention has described a dual-rate based equalization technique where a low-order FIR filter operates at a lower rate for equalization of a loudspeaker-room response at low frequencies, and a low-order minimum-phase FIR filter operates at a higher rate for higher frequency equalization. Due to the design of two complementary band filters for separately performing low and high frequency equalization, the system delay is kept at a minimum while maintaining excellent equalization performance as demonstrated in the paper. The splicing between the two equalization filters, operating at different rates, for maintaining a flat magnitude response in the transition region of the two complementary filters is done automatically through level adjustment of one equalization filter relative to the other. The present invention may be expanded to include this technique for multi-position (that is, multi-listener) equalization.

While the invention herein disclosed has been described by means of specific embodiments and applications thereof, numerous modifications and variations could be made thereto by those skilled in the art without departing from the scope of the invention set forth in the claims.

We claim:

1. A method for equalizing audio signals, the method comprising:
- processing an input signal through a low frequency equalization path comprising:
  - low pass filtering the input signal to obtain a low pass filtered signal;
  - sub sampling the low pass filtered signal to obtain a sub-sampled signal;
  - equalizing the sub-sampled signal with a low frequency equalization filter F(z) to obtain an equalized low frequency sub-sampled signal, the low frequency equalization filter F(z) computed by the steps:
    - low pass filtering a Loudspeaker Room Transfer Function (LRTF) H(z);
    - sub sampling the filtered LRTF H(z);
    - computing the low frequency equalization filter F(z) from the sub sampled filtered LRTF H(z);
    - up sampling the low frequency equalization filter F(z) to obtain a high sample F'(z);
    - computing C(z) as the product of the high sample F'(z) and the LRTF H(z);
    - computing the magnitude of C(z); and
    - computing a mean level L1 of the magnitude of C(z);
  - up sampling the equalized low frequency sub-sampled signal to obtain an up-sampled low frequency equalized signal; and
  - low pass filtering the up-sampled low frequency equalized signal to obtain a low frequency equalized signal;
- processing the input signal through a high frequency equalization path comprising:
  - high pass filtering the input signal to obtain a high pass filtered signal; and
  - equalizing the high pass filtered signal with a high frequency equalization filter G(z) to obtain a high frequency equalized signal, the high frequency equalization filter G(z) computed by the steps:
    - high pass filtering the LRTF H(z);
    - computing an initial high frequency equalization filter G(z) from the high pass filtered LRTF H(z);
    - computing D(z) as the product of the initial high frequency equalization filter G(z) and LRTF H(z);
    - constraining FFT bins of the D(z) below fs/2M to 0 dB;
    - computing a mean level L2 of the constrained magnitude; and
    - applying a level adjustment of $10^{((L1-L2)/20)}$ to the initial G(z) to obtain the high frequency equalization filter G(z); and
- summing the low frequency equalized signal and the high frequency equalized signal to obtain an equalized signal.

2. The method of claim 1, further including leveling at least one of the equalized signals before summing to provide a flat overall magnitude response.

3. The method of claim 2, further including leveling the equalized high pass filtered signal to obtain an equalized signal to sum with the low frequency equalized signal.

4. The method of claim 1, wherein:

low pass filtering the input signal to obtain a low pass filtered signal comprises low pass filtering the input signal to obtain a low pass filtered signal with a first Infinite Impulse Response (IIR) filter; and low pass filtering the up-sampled low frequency equalized signal comprises low pass filtering the up-sampled low frequency equalized signal with a second IIR filter.

5. The method of claim 4, wherein high pass filtering the input signal comprises high pass filtering the input signal using a third IIR filter.

6. The method of claim 1, wherein:

computing F(z) comprises computing F(z) using an LPC model; and computing an initial G(z) comprises computing an initial G(z)) using the LPC model.

7. The method of claim 1, further including:

smoothing the magnitude of C(z) and computing the mean level L1 of the smoothed magnitude of C(z); and smoothing the magnitude of D(z) and computing the mean level L2 of the smoothed magnitude of D(z).

8. The method of claim 1, wherein:

processing an input signal comprises processing a 48 KHz input signal; and sub sampling the low pass filtered signal to obtain a sub-sampled signal comprises sub sampling the low pass filtered signal to obtain a 2 KHz sub-sampled signal.

9. A method for equalizing audio signals, the method comprising:

one time computing a low frequency equalization filter F(z) by the steps:

low pass filtering a Loudspeaker Room Transfer Function (LRTF) H(z);

sub sampling the filtered LRTF H(z); and computing the low frequency equalization filter F(z) from the sub sampled filtered LRTF H(z); and one time computing a high frequency equalization filter G(z) by the steps:

high pass filtering the LRTF H(z); and computing the high frequency equalization filter G(z) from the high pass filtered LRTF H(z);

processing an input signal through a low frequency equalization path comprising:

low pass filtering the input signal to obtain a low pass filtered signal;

sub sampling the low pass filtered signal to obtain a sub-sampled signal;

equalizing the sub-sampled signal with the low frequency equalization filter F(z) to obtain an equalized low frequency sub-sampled signal, the low frequency equalization filter F(z) computed by the steps:

low pass filtering a Loudspeaker Room Transfer Function (LRTF) H(z);

sub sampling the filtered LRTF H(z);

computing the low frequency equalization filter F(z) from the sub sampled filtered LRTF H(z);

up sampling the low frequency equalization filter F(z) to obtain a high sample F'(z);

computing C(z) as the product of the high sample F'(z) and the LRTF H(z);

computing the magnitude of C(z); and computing a mean level L1 of the magnitude of C(z);

up sampling the equalized low frequency sub-sampled signal to obtain an up-sampled low frequency equalized signal; and low pass filtering the up-sampled low frequency equalized signal to obtain a low frequency equalized signal;

processing the input signal through a high frequency equalization path comprising:

high pass filtering the input signal to obtain a high pass filtered signal; and equalizing the high pass filtered signal with the high frequency equalization filter G(z) to obtain a high frequency equalized signal, the equalizing of the high pass filter signal comprising the steps:

high pass filtering the LRTF H(z);

computing an initial high frequency equalization filter G(z) from the high pass filtered LRTF H(z);

computing D(z) as the product of the initial high frequency equalization filter G(z) and LRTF H(z);

constraining FFT bins of the D(z) below fs/2M to 0 dB;

computing a mean level L2 of the constrained magnitude; and applying a level adjustment of $10^{((L1-L2)/20)}$ to the initial G(z) to obtain the high frequency equalization filter G(z); and summing the low frequency equalized signal and the high frequency equalized signal to obtain an equalized signal.

10. A method for equalizing audio signals, the method comprising:

processing an input signal through a low frequency equalization path comprising:

low pass filtering the input signal to obtain a low pass filtered signal;

sub sampling the low pass filtered signal to obtain a sub-sampled signal;

equalizing the sub-sampled signal with a low frequency equalization filter F(z) to obtain an equalized low frequency sub-sampled signal, the low frequency equalization filter F(z) computed by the steps:

low pass filtering a Loudspeaker Room Transfer Function (LRTF) H(z);

sub sampling the filtered LRTF H(z);

computing the low frequency equalization filter F(z) from the sub sampled filtered LRTF H(z);

up sampling the low frequency equalization filter F(z) to obtain a high sample F'(z);

computing C(z) as the product of the high sample F'(z) and the LRTF H(z);

computing the magnitude of C(z); and computing a mean level L1 of the magnitude of C(z);

up sampling the equalized low frequency sub-sampled signal to obtain an up-sampled low frequency equalized signal; and low pass filtering the up-sampled low frequency equalized signal to obtain a low frequency equalized signal;

processing the input signal through a high frequency equalization path comprising:

high pass filtering the input signal to obtain a high pass filtered signal; and equalizing the high pass filtered signal with a high frequency equalization filter G(z) to obtain a high frequency equalized signal, the high frequency equalization filter G(z) computed by the steps:

high pass filtering the LRTF H(z);

computing an initial high frequency equalization filter G(z) from the high pass filtered LRTF H(z);

computing D(z) as the product of the initial high frequency equalization filter G(z) and LRTF H(z);

constraining FFT bins of the D(z) below fs/2M to 0 dB;

computing a mean level L2 of the constrained magnitude; and applying a level adjustment of $10^{((L1-L2)/20)}$ to the initial G(z) to obtain the high frequency equalization filter G(z); and summing the low frequency equalized signal and the high frequency equalized signal to obtain an equalized signal.

* * * * *